United States Patent [19]

Kellogg et al.

[11] Patent Number: 4,698,236

[45] Date of Patent: Oct. 6, 1987

[54] AUGMENTED CARBONACEOUS SUBSTRATE ALTERATION

[75] Inventors: Edwin M. Kellogg, Lexington; John M. Dobbs, South Hamilton; Gregory J. Dunn, Gloucester, all of Mass.; Henry C. Kaufmann, Danville, N.H.; William Thompson, Rockport, Mass.

[73] Assignee: Ion Beam Systems, Inc., Beverly, Mass.

[21] Appl. No.: 815,824

[22] Filed: Jan. 2, 1986

Related U.S. Application Data

[63] Continuation-in-part of Ser. No. 665,251, Oct. 26, 1984, abandoned.

[51] Int. Cl.$^4$ .............................................. B05D 3/06
[52] U.S. Cl. .................................. 427/43.1; 427/140; 430/5
[58] Field of Search .................. 427/43.1, 140, 38, 39, 427/86, 93; 430/5

[56] References Cited

U.S. PATENT DOCUMENTS

| | | |
|---|---|---|
| 3,080,481 | 3/1963 | Robinson . |
| 3,679,497 | 7/1972 | Handy et al. .................. 427/43.1 |
| 3,930,155 | 12/1975 | Kanatoma et al. . |
| 3,961,103 | 6/1976 | Aisenberg ........................ 427/41 |
| 4,085,330 | 4/1978 | Wolfe ............................ 250/492 A |
| 4,316,093 | 2/1982 | Broers et al. .................. 427/43.1 |
| 4,340,654 | 7/1982 | Campi ............................ 427/140 |
| 4,357,364 | 11/1982 | Jones ............................ 427/44 |
| 4,382,100 | 5/1983 | Holland .......................... 427/38 |
| 4,460,436 | 7/1984 | Hiraoka .......................... 427/43.1 |
| 4,463,073 | 7/1984 | Miyauchi et al. ................ 430/5 |
| 4,466,992 | 8/1984 | Dreiling ........................ 427/140 |
| 4,503,329 | 3/1985 | Yamaguchi . |
| 4,547,432 | 10/1985 | Pitts et al. ..................... 427/35 |
| 4,548,883 | 10/1985 | Wagner . |

FOREIGN PATENT DOCUMENTS

| | | | |
|---|---|---|---|
| 135276 | 11/1978 | Japan ................................ 430/5 |
| 32630 | 2/1982 | Japan ................................ 430/5 |
| 102019 | 6/1982 | Japan ................................ 430/5 |
| 6133 | 1/1983 | Japan ................................ 430/5 |
| 201764 | 5/1985 | Japan . |
| 38131 | 9/1985 | Japan . |

OTHER PUBLICATIONS

Takakura et al. (1984), 15th Symposium on Ion Implan. and Submicron Fabrication, Feb. 1-3 (1984), pp. 125-128.
Kaito and Yamamoto, Mask Repair Using Focused Ion Beam, ISIAT, Tokyo, (Jun. 1985).
Seiko Instruments, Ion Micro Scan SIR-1000 Mask Repair System.
Takahura et al., "Maskless Deposition Using Focused Ion Beam", 15th Symposium on Ion Implantation and Sub-Micron Fabrication (Feb. 1984).

(List continued on next page.)

Primary Examiner—John H. Newsome

[57] ABSTRACT

Accurately altering a precisely located site on a substrate by: (a) providing a vacuum chamber; (b) providing an energy beam; (c) providing a source of a hydrocarbon and a conduit extending between the source and the chamber, the hydrocarbon being capable of being adsorbed in the substrate and of interacting with the energy beam to alter the substrate; (d) positioning the substrate in the chamber to be exposed to hydrocarbon delivered by the conduit; (e) introducing into the conduit a carrier having a vapor pressure above the vapor pressure of the hydrocarbon, the carrier being in vapor form under conditions existing in the conduit and having a bulk velocity that transports the hydrocarbon by molecular collisions into the chamber, the hydrocarbon being adsorbed on the surface of the substrate, free carrier molecules being drawn off sufficiently rapidly to maintain low pressure in the chamber; and (e) while maintaining the low chamber pressure, directing the energy beam to the site in the presence of the absorbed hydrocarbon, in a manner to convert the hydrocarbon to a coherent carbonaceous deposit of predetermined desired form, adherent to the substrate at the site to render the site opaque. Most preferably, a focused ion beam is used to repair an opaque defect in a photolithographic mask.

35 Claims, 9 Drawing Figures

OTHER PUBLICATIONS

Lincoln et al (1983), J. Va. Sci. Techn. B1 (No. 4): 1043–1046.

Geis et al. (1981), J. Vac. Sci. Techn. 19(4): 1390–1393.

Ehrlich et al, "One-Step Repair of Transparent Defects in Hard-Surface Photolithographic Masks Via Laser Photodeposition", IEEE Electron Device Letters, vol. EDL-1, No. 6, Jun. 1980 (pp. 101–103).

Gamo et al. (1984), Intern. Conf. on Solid State Devices and Materials (Kobe 9/1/84).

Gamo et al. (1984), Japanese J. Appl. Physics, 23(5): L293–L295.

Osias et al. (1984), Kodak Microelectronics Seminar, San Diego, Oct. 29–30, Abstract.

Kellogg, Ph.D. thesis, University of Pennsylvania, Nov. 1965, pp. 14–18.

Moller et al. (1981), Nuclear Instruments and Methods, vol. 182/183, pp. 297–302.

Venkatesan et al., (1983), J. Applied Phys. Letters, 54:3150–3153.

Calcagno et al., (1984), J. Applied Phys. Letters, 44:761–763.

AUGMENTED CARBONACEOUS SUBSTRATE ALTERATION

CROSS-REFERENCE TO RELATED APPLICATION

This application is a continuation-in-part of the earlier application of Edwin M. Kellogg, Ser. No. 655,251, filed Oct. 26, 1984, now abandoned which is hereby incorporated by reference and the subject matter of which, as it relates to this application, was commonly owned with the subject matter of this application at the time of the respective inventions.

BACKGROUND OF THE INVENTION

This invention relates to introducing substances into a vacuum, for example, for alteration of a precisely localized site on a substrate such as a transparent defect site in a photolithographic mask.

Photolithographic masks are used to pass light (usually ultraviolet light) to a workpiece in a specified pattern. Such masks often consist of a clear substrate such as glass or quartz onto which a pattern of an opaque material such as chrome has been deposited. For various reasons, a mask may develop or be manufactured with small defects or imperfections, for example pinholes in the chrome layer, that allow exposure of the workpiece in undesired locations. Also, it may be desirable to alter the pattern on the mask, by rendering a previously transparent site opaque. Mask alteration should be rapid, automated, effective and durable without complex processing steps that can introduce contaminants or cause further defects.

One way to repair mask imperfections involves a lift-off procedure using a positive photoresist. The resist is applied to the affected area, exposed, and developed, after which any resist that was applied to a transparent imperfection is removed. An opaque layer, e.g., of aluminum, is deposited over the area, and any of the deposited layer that overlies photoresist is lifted off using a solvent that dissolves the resist.

Laser beams are also used to repair photolithographic mask defects, particularly opaque defects, by removing the undesired opaque material.

Three publications [Gamo et al. (1984) Intern. Conf. on Solid State Devices and Materials (Kobe 9/1/84); Gamo et al. (1984) Japanese J. Appl. Physics 23(5): L293-L295; and Takahura et al. "Maskless Deposition Using Focused Ion Beam" 15th Symposium On Ion Implantation and Sub-micron Fabrication, February 1984] disclose the use of a focused or broad argon or gold ion beam in an atmosphere of trimethyl aluminum. The resulting deposited film contains oxygen, carbon, and aluminum in varying ratios. The technique is reported to be promising for mask repair or mask fabrication for optical, ion, or X-ray lithography. It is further reported that inclusion of C and O in the film may be decreased by using other metallo-compounds (tungsten hexafluoride is suggested) and reducing the background pressure. Finally, the rate of film deposition reportedly is increased if the molecules resulting from the bombardment are not volatile.

Osias et al. (1984) Kodak Microelectronics Seminar, San Diego, October 29-30, Abstract, discloses mask repair using an ion flood beam to convert a previously applied layer of photoresist into a vitreous carbon film. "The resultant material is an excellent hard mask fabrication or repair material having scratch resistance and UV optical density comparable to that of chrome and having chemical resistance and substrate adhesion superior to that of chrome." The disclosed method involves wet processing of a negative photoresist to create a layer of resist at the site of transparent imperfections.

Kellogg, Ph.D. thesis, University of Pennsylvania, November 1965, discloses a method of making a self-supporting carbon target for helium bombardment by heating a nickel foil substrate in an atmosphere of methyl iodide to deposit a carbon film on the nickel. Hydrogen is released as a gas, and iodine is deposited as an amorphous layer on the walls of the chamber. The nickel is dissolved later to leave a carbon target.

Moller et al. (1981) Nuclear Instruments and Methods Vol. 182/183, pp. 297-203 discloses ion-induced carbon buildup on a nickel surface in various hydrocarbon atmospheres at pressures in the $10^{-6}$ millibar ($7.5 \times 10^{-7}$ torr) range; for example, unwanted buildup from vacuum pump oil occurs when performing ion implantation, ion beam analysis, or experimental nuclear physics. Methane, benzene, roughing pump oil, and squalene were bombarded with ion beams of hydrogen, helium, and lithium ions at between 100 and 400 keV. The gases were provided as controlled atmospheres ($10^{-7}$ to $10^{-5}$ mbar) by means of a needle valve or by means of a small liquid container installed in a vacuum chamber; the container temperature could be varied between $-30°$ C. and $40°$ C., depending on the gas. The residual gas consists mainly of water, nitrogen, carbon dioxide, and argon. The amount of deposited material increases with increasing molecular weight of the gas and with dose rate (between $1.5 \times 10^{13}$ and $1 \times 10^{15}$ cm$^{-2}$ seconds$^{-1}$). The authors conclude that deposition is controlled by ion-induced polymerization in an adsorbed layer.

Venkatesan et al., (1983) J. Applied Phys. Letters 54: 3150-3153 disclose irradiating polymer films (e.g., positive photoresists) with high electron or ion beam doses causing the resist layer to become conductive and to behave as a negative resist as a result of carbonization—i.e., creation of a highly cross-linked carbon structure. The Raman spectra of such films resemble, but are consistently different from, the spectra of amorphous carbon films.

Calcagno et al., (1984) J. Applied Phys. Letters 44: 761-763 disclose ion bombardment of frozen benzene to produce a stable polymeric film. The resulting film has a carbon-to-hydrogen ratio of between 1:2 and 1:3 as compared to 1:1 for benzene.

Lincoln et al. (1983) J. Vac. Sci. Techn. B1(No. 4): 1043-1046; and Geis et al. (1981) J. Vac. Sci. Techn. 19(4): 1390-1393 disclose etching a substrate with a reactive gas such as chlorine, using an Ar+ flood beam to assist the etching. Etching takes place in a vacuum chamber and Cl$_2$ gas is introduced through a gas inlet shown in FIG. 1 of each article, positioned approximately 3.5 cm from the substrate.

Aisenberg U.S. Pat. No. 3,961,103 discloses thin film deposition apparatus having an ion source (10 in FIG. 1) to generate ionized plasma (Ar, H, He, N, or O). A constrictor electrode 26 and an extraction electrode 24 have small apertures to permit differential pumping to maintain a good vacuum in deposition chamber 20, while a somewhat higher pressure is maintained in plasma ion source 10 (4: 4-9). The use of a hydrocarbon gas in chamber 10 permits the deposition of carbon films since ions exiting from the ion source will consist of carbon ions and hydrogen ions (5: 61-65).

Holland U.S. Pat. No. 4,382,100 discloses applying a layer of carbonaceous material to a surface by exposing the surface to a plasma generated in a hydrocarbon gas. Conditions may be controlled to select a polymeric layer, an amorphous layer, or a graphite layer.

Wolfe, U.S. Pat. No. 4,085,330 discloses a liquid metal ion source and a gaseous ion source for removal of areas of a mask. The liquid metal ion source is said to be advantageous because there is no need for a pressure differential between the source and the deposition chamber (4: 21-36).

Japan 53-135276 discloses repairing a photomask by irradiating vacuum pump oil with an electron beam.

Japan 58-6133 discloses repairing a mask pattern by electron beam irradiation of a carbon-containing gas to bake carbon molecules to the mask surface.

Japan 57-32630 discloses repairing a photo-mask by applying powdered carbon dissolved in albumin and sintering with a laser beam.

Japan 57-102019 discloses ion-beam irradiation to remove undesired material from an X-ray adsorbing mask pattern and ion injection to correct pin holes in the pattern.

Miyauchi U.S. Pat. No. 4,463,073 discloses an optical system for viewing repair of a mask defect.

SUMMARY OF THE INVENTION

In a first aspect, the invention features accurately altering a precisely located site on a substrate by: (a) providing a vacuum chamber; (b) providing an energy beam; (c) providing a source of a hydrocarbon and a conduit extending between the source and the chamber, the hydrocarbon being capable of being adsorbed on the substrate and of interacting with the energy beam to alter the substrate; (d) positioning the substrate in the chamber to be exposed to hydrocarbon delivered by the conduit; (e) introducing into the conduit a carrier having a vapor pressure above the vapor pressure of the hydrocarbon, the carrier being in vapor form under conditions existing in the conduit and having a bulk velocity that transports the hydrocarbon by molecular collisions into the chamber, the hydrocarbon being adsorbed on the surface of the substrate, free carrier molecules being drawn off sufficiently rapidly to maintain low pressure in the chamber; and (e) while maintaining the low chamber pressure, directing the energy beam to the site in the presence of the adsorbed hydrocarbon, in a manner to convert the hydrocarbon to a coherent carbonaceous deposit of predetermined desired form, adherent to the substrate at the site in order to render the site opaque.

The energy beam may be a charged particle beam (e.g., an electron beam or other charged particle beam) or a laser beam; most preferably, it is an ion beam. Also preferably, the beam is focused to control the location of the conversion. As used in this application, "focused beams" are beams that have been focused to a shaped, relatively broad (e.g., for ion beams, 5μ to 10μ) beam with high resolution at the beam edge, as well as Gaussian beams focused to a small spot. For either type of focused beam, the beam has a high resolution; e.g., for ion beams, the shaped beam edge resolution is about 1μ or less, and, for the Gaussian beam, the spot size has a diameter of about 1μ or less. The term "low chamber pressure" means that the pressure is sufficiently low to substantially avoid any gas-created contaminants, and, in the case of a charged particle beam, the pressure is sufficiently low to avoid gas-created dispersal; e.g., the beam remains focused as it passes through the vacuum chamber. For ion beams, a pressure on the order of $10^{-4}$ to $10^{-6}$ torr in the chamber is satisfactory for this purpose.

The invention provides a coherent, adherent, and durable opaque hydrocarbon coating layer, specifically and accurately positioned at the site that is to be altered, e.g., the transparent mask defect, without the need for wet processing steps that can create particulates and damage mask surfaces. The focused ion beam in particular provides accuracy, a high energy-loss rate, and resolution to control the deposition of the layer. The layer provides good adherence to both the mask substrate and the mask opaque layer surrounding the site. The layer is sufficiently hard or resistant to withstand abrasion encountered in the course of ordinary photolithographic processing. Potentially troublesome materials that could contaminate extremely pure semiconductor workpieces are avoided because non-carbonaceous products preferably are removed as a gas. Dangerous or poisonous materials can also be avoided; or, if they are used, such materials can be better controlled.

It is also important to provide a relatively thick solid hydrocarbon layer, notwithstanding the need for extremely low pressure along the beam line in the chamber. Such a thick solid coating requires delivery of a substantial amount of hydrocarbon that, in vapor form, could exert substantial pressure and/or occupy substantial volume. The dilemma is how to provide such a substantial amount of material at the site while maintaining low enough pressures along the beam line. A relatively heavy hydrocarbon is selected to enhance its ability to adsorb, first in a monolayer by chemadsorption to the substrate, and then by physical adsorption to build layers on that monolayer. The relatively higher van der Waals forces exerted by low vapor pressure substances are beneficial in this regard, so as to provide relatively rapid adsorption and enable shorter repeat cycle times as described below. This same characteristic makes it difficult to deliver the compound in vapor form. The use of the carrier vapor is particularly advantageous in this regard to avoid time-dependent instabilities that could arise from undesired hydrocarbon condensation.

The ability to provide localized thick-layer adsorption while maintaining relatively low chamber pressure is also important, because it reduces the time required to evacuate the chamber after performing the deposition, e.g., to introduce a new substrate or to correct opaque defects by sputtering away unwanted material by beam bombardment in a vacuum. In this way, the invention increases throughput.

The ion beam is simultaneously converting adsorbed hydrocarbon to a solid carbonaceous deposit, and sputtering away the deposit. If the beam dwells long enough at a single site to deplete the adsorbed hydrocarbon, then the sputtering will begin to reduce the layer thickness. To avoid this problem, the beam is preferably cycled (e.g. by moving it from site to site or scanning it in a raster scan) to a new location while adsorbed hydrocarbon is replenished at the original site; when the beam returns to the original site, it converts the adsorbed hydrocarbon to an additional solid layer, thus increasing layer thickness. The invention is also advantageous because hydrocarbon is supplied to be adsorbed at the substrate quickly so that the beam can recycle quickly. Thus the beam is directed to the site repeatedly, with sufficient delay between repetitions to permit the hydrocarbon to be readsorbed after it is depleted, so that the repetitions increase the thickness of the cabon layer that is deposited.

Also in preferred embodiments: the ratio of the molar concentration of the ion-interactive hydrocarbon to the concentration of the carrier in the conduit is on the order of 0.8 or less; the vapor pressure in the conduit is approximately 30–500 millitorr; the hydrocarbon and the carrier are provided in a single pressurized reservoir and are non-reactive with one another under the transporting conditions and under conditions in the reservoir. Preferably, the carrier is selected to have an equilibrium vapor pressure at room temperatue on the order of 1–300 torr, and it is an organic compound comprising between 1 and 10 carbon atoms, e.g. a straight-chained, branched or cyclic alkane, alkene, alcohol, aldehyde, ketone, or ether. Most preferably, the carrier has between 5 and 9 carbon atoms and is pentane, hexane, heptane, octane, acetone, or benzene; the carrier can be a single compound or a mixture of compounds.

The ion-interactive hydrocarbon has at least 10 carbon atoms, and has a vapor pressure at room temperature less than 1 torr; the hydrocarbon may be a mixture of compounds, e.g. alkanes; most preferably it is selected from pyrene, squalene, tetramethylpentadecane, dodecane, and vinylanthracene.

Also in preferred embodiments the ion beam source is a liquid metal source focused to a resolution of at least $1\mu$, and the beam energy is between about 10 and 70 keV. To direct the beam, an image of the site is formed before making the deposit, e.g. by sensing charged particles emitted from said site when it is bombarded by the beam. The site requiring alteration is a transparent defect in a pattern of a photolithographic mask and the deposit is one which renders the defect opaque to photolithographic light, such as a carbon deposit on a substrate comprised predominantly of compounds of silicon and oxygen. Also preferably, the apparatus comprises means for forming an image of the site and means for positioning the site in the beam path, and a beam deflector for scanning the beam in a scan pattern over the area of the site on the basis of the image. The beam deflector is also adapted to scan the defect site repeatedly to overcome localized depletion of the gas as described above. The apparatus further comprises a means for imaging said site comprising a detector providing a signal representative of charged particles emitted in response to bombardment of the mask by said beam.

To increase pressures locally at the site to be altered, a directed gas inlet is positioned to provide a localized supply of the compound at the site. For example, the inlet is a small diameter tubing angled with respect to the beam axis which ends a distance above the substrate on the order of the tubing diameter.

Another way to enhance pressure locally at the substrate is to provide baffles defining a series of adjacent chamber regions along the path of the focused ion beam beginning at the mask, and maintain differential pressures of the ion-depositable compound in the chamber regions, the greatest pressure being maintained in the region containing the site, the pressure at the site being great enough to cause the hydrocarbon to be adsorbed at the site. Specifically, the chamber comprises at least two baffles defining a series of adjacent chamber regions along the path of the ion beam beginning at the mask, each baffle defining an opening positioned along the beam path to allow the beam to pass therethrough; (4) a gas inlet adapted to introduce hydrocarbon into a first chamber region for deposition at the site, the first chamber region containing the site; and (5) an outlet from a second chamber region, the outlet communicating with a vacuum pump, the second chamber region being spaced upwardly along the beam path from the first chamber region, the pressure in the first chamber region thereby being relatively greater than the pressure in the second chamber region. Preferably, the first baffle and the second baffle each comprises a horizontal member defining the opening, the horizontal member of the first baffle being spaced a distance below the horizontal member of the second baffle, the distance being at least two times the diameter of either of the openings in the baffles.

In a second aspect, the invention generally features accurately altering a precisely localized site on a substrate by: (1) placing the substrate in a vacuum chamber; (2) forming an image of the site; (3) by means of an ion source and associated focusing optics, providing a focused ion beam; (4) introducing hydrocarbon in the chamber, localized and adsorbed at the substrate; (5) simultaneously therewith maintaining the pressure in the chamber low enough to allow the focused beam to pass substantially without gas-created dispersal; and (6) on the basis of the image, directing the beam to the site, so that the scanning beam converts the adsorbed hydrocarbon to a coherent carbonaceous opaque deposit of predetermined desired form, adherent to the substrate at the site, to render the site opaque.

In a third aspect, the invention features a method in which hydrogen gas is used in order to reduce a silicon compound in the mask substrate to form a coherent opaque silicon deposit of predetermined desired form, adherent to the mask at the site.

Other features and advantages of the invention will be apparent from the following description of the preferred embodiment thereof and from the claims.

DESCRIPTION OF THE PREFERRED EMBODIMENT

Specific preferred embodiments of the invention directed to repair of opaque masks using a focued ion beam are described below, without limitation on the following claims.

APPARATUS

Figure 1:
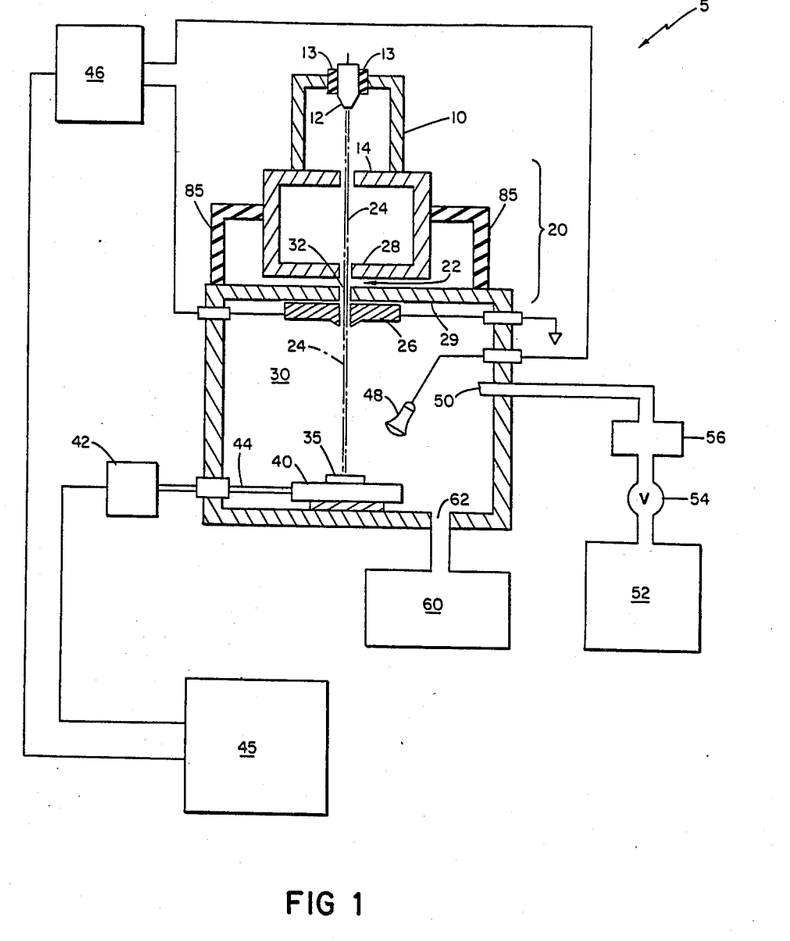
FIG. 1 is a highly diagrammatic sectional representation of apparatus for repairing a mask.

In FIG. 1, apparatus 5 for repairing a photolithographic mask includes, in general, ion beam source 10 and beam focusing column 20 arranged to deliver a focused ion beam 24 to vacuum chamber 30 through opening 32. Within chamber 30 is an X-Y stage table 40 adapted to hold mask 35 in the path of ion beam 24. A gas delivery system includes an inlet tube 50 (broken away in FIG. 1) extending through the wall of chamber 30. A vacuum pump 60 communicates with chamber 30 through port 62 to evacuate the chamber. These various components of the mask repair apparatus and the functioning of that apparatus are discussed in greater detail below.

Ion source 10 is a liquid metal ion source for generating a stable focusable ion beam. For example, suitable ion sources are disclosed in Clampitt et al., U.S. Pat. No. 4,088,919, Jergenson, U.S. Pat. No. 4,318,029, and Jergenson, U.S. Pat. No. 4,318,030, each of which is hereby incorporated by reference. The source includes a tip 12 from which metal ions are emitted under the action of extractor electrode 14 in a continuous and stable beam that can be focused by column 20. Electrode 14 is insulated from tip 12 by electrical insulation 13.

Focusing column 20 includes lens 22 to deliver a focused ion beam through opening 32 in chamber 30. Specifically, an axial electric field between conductive elements 28 and 29 creates an electrostatic immersion lens 22. Insulation 85 electrically insulates chamber 30 from focusing column 20. A suitable focusing column is described in Wang et al. J. Vac. Sci. Tech. 19(4): 1158-1163 (1981) which is hereby incorporated by reference.

Repair apparatus 5 is able to control the point on the mask that is bombarded by the ion beam and to ensure that the resulting deposit completely covers the mask defect. To achieve this, the apparatus includes an X-Y stage table 40 controlled by stage drive motor 42 connected thereto by a transmission shaft 44 through a sealed bearing in the wall of chamber 30. Alternatively, the motor may be positioned inside the vacuum chamber. Motor 42 is controlled by stage drive electronics 45, which in turn are connected to computer pattern generator and image display 46. Display 46 is supplied by electron detector 48 with a signal representative of electrons generated by the collision of beam 24 with the mask to indicate the position of the beam on the mask as described in more detail below. Alternatively, detector 48 can be used to detect ions emitted from the mask during beam bombardment. An electron source (not shown) also can be provided to neutralize charge build-up during ion bombardment for imaging. Apparatus 5 also includes a means for controlling the beam direction. Specifically, a time-variable voltage is supplied to an electrostatic beam deflector 26 positioned inside chamber 30 at opening 32 to enable deflection of the beam according to a desired pattern as described below.

By selecting conditions and apparatus to enhance local gas concentrations, it is possible to achieve a deposition rate that exceeds the rate of material loss due to ion beam sputtering, and thus to provide a coherent opaque deposit that is carefully limited to the site to be altered, e.g., the defect site.

Specifically, the gas delivery system includes a pressurized gas bottle 52, a regulator 54 and micro-leak valve 56 to deliver extremely low gas pressures (e.g. between about $10^{-2}$ and $10^{-6}$ torr) to inlet tube 50. This gas pressure should be low enough to avoid destabilizing the ion source or dispersing the beam as it travels through the vacuum chamber; at the same time, the pressure should be high enough to provide a deposition rate that overcomes sputtering.

GENERAL PROCEDURE

To repair a mask such as chrome/glass mask 35, the mask is placed on X-Y table 40 and chamber 30 is pumped down e.g., to $3 \times 10^{-5}$ Torr. Source 10 and column 20 are activated to direct a focused gallium ion beam 24 at mask 35. When beam 24 strikes mask 35, electrons are emitted and detected by detector 48 (for example, a channel electron multiplier such as one manufactured by Galileo Electrooptics Corp., Sturbridge Mass.), generating a signal to computer display 46 to generate a display in much the same manner as occurs in an electron microscope display. The signal generated will depend upon the characteristics of the specific region of mask 35 under bombardment by beam 24. Thus it is possible, by means of feedback from computer display 46 and knowledge of the desired mask pattern, to use electronics 45 to move table 40 to position a mask defect in the path of beam 24, with an accuracy of ±0.05 microns.

Ion source 10 and column 20 are capable of delivering a high-energy focused liquid-metal ion beam 24, e.g., a gallium or gold ion beam of densities of at least $10^{-3}$ amp/cm$^2$ and up to about 1 amp/cm$^2$ over a spot size that provides the desired accuracy and resolution to control the carbon deposited, e.g. a spot size of 0.1 to 1.0 microns (micrometers). Non-liquid-metal ion sources generally do not provide dose rates in excess of $3 \times 10^{-5}$ amps cm$^{-2}$. Ion beam energy should be great enough to enable focusing (at least 10 keV). A preferred range of operation is 10 to 70 keV, most preferably 25-50 keV. Advantageously, such energies are satisfactory for removing opaque defects, so that both types of defects can be repaired by the same piece of apparatus.

Once beam 24 is generally centered in the mask defect, hydrocarbon gas from bottle 52 is introduced into the defect region in a manner described in more detail below. Since the size of a pin-hole defect may be upwards from about 0.25 microns to about 100 microns or more, which is much greater (e.g. over 10 times greater) than the beam spot size, beam deflector 26 is activated by computer display 46 to scan the beam to cover the entire defect. For example, a raster scan can be generated to cover a polygon that covers the entire site with some overlap of the chrome layer.

Alternatively, the beam can be positioned and moved from point to point according to predetermined computer-controlled positions; the term "scan" is used herein to include such point-to-point movement.

When repairing the defect, carbon is locally deposited as described elsewhere herein, momentarily depleting the hydrocarbon supply at the beam spot. By repeatedly scanning the beam over a defect site, while controlling the repeat rate to allow the hydrocarbon to absorb from the gaseous environment and thus replenish each scanned spot before the beam spot returns to the point, the carbon deposit can be increased over the area until the designed thickness is achieved. The "dwell time" (the time that the beam dwells at a given point) as well as the repeat rate (or "loop time") can be selected to allow the above to allow the above replenishment while generally minimizing the time needed to perform the repair. For example the dwell time can be between 0.1-200 microseconds, and the loop time can be between 0.1-20 milliseconds.

Figure 2:
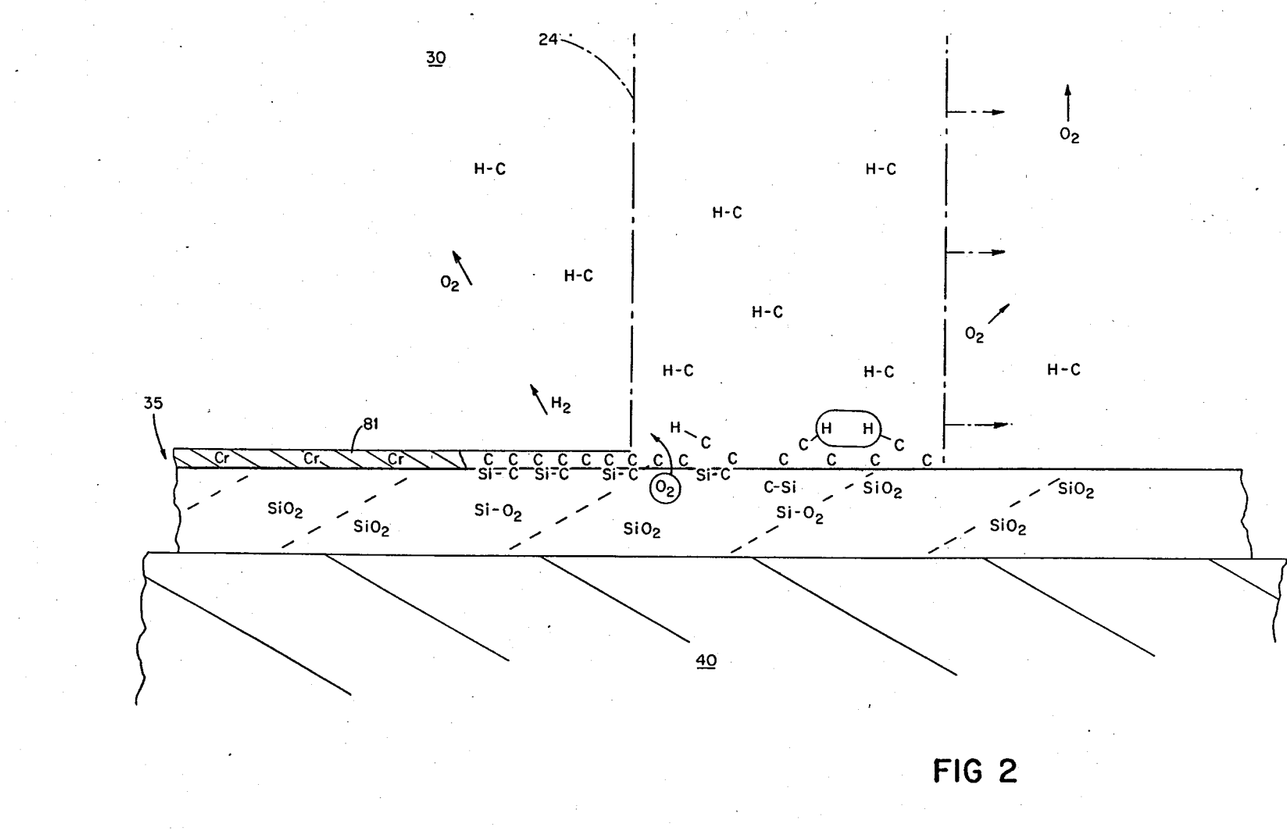
FIG. 2 is a greatly enlarged diagrammatic representation of the mask repair process.

FIG. 2 depicts in a very diagrammatic way a general description of interaction between beam 24, hydrocarbon above the substrate, and mask 35. Specifically, at the left side of the figure, the chrome layer 81 on mask 35 ends at the perimeter of a transparent defect that is being repaired. The far side of that deflect is not shown. Beam 24, represented by broken lines, is scanning from left to right. Beam 24 is between 0.1 and 10 microns in diameter. As a result of beam particle energy, hydrogen-carbon bonds are broken. Hydrogen is formed and carbon atoms combine either with each other and preferably with atoms or compounds in the mask. Specifically, the carbon atoms may combine with the silicon of the silicon dioxide in the glass or quartz, releasing oxygen gas and forming a silicon carbide transition layer. On top of that transition layer, tenacious, hard, opaque, intimately bound, carbon layers are deposited, probably in amorphous (vitreous) form, and hydrogen gas is released.

Figure 7A:
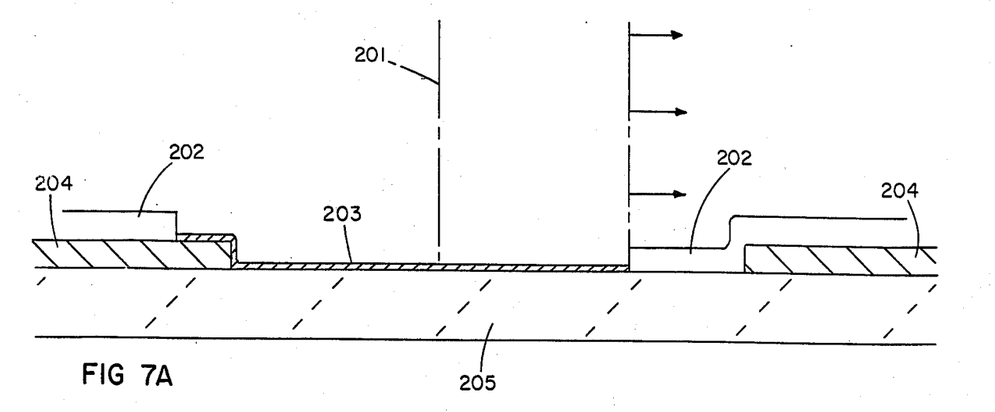
FIGS. 7A–7C are diagrammatic representations of different stages in a mask repair process.
Figure 7B:
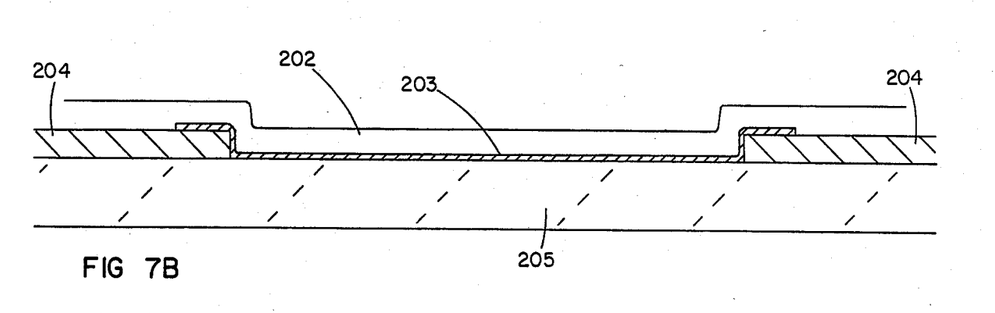
Figure 7C:
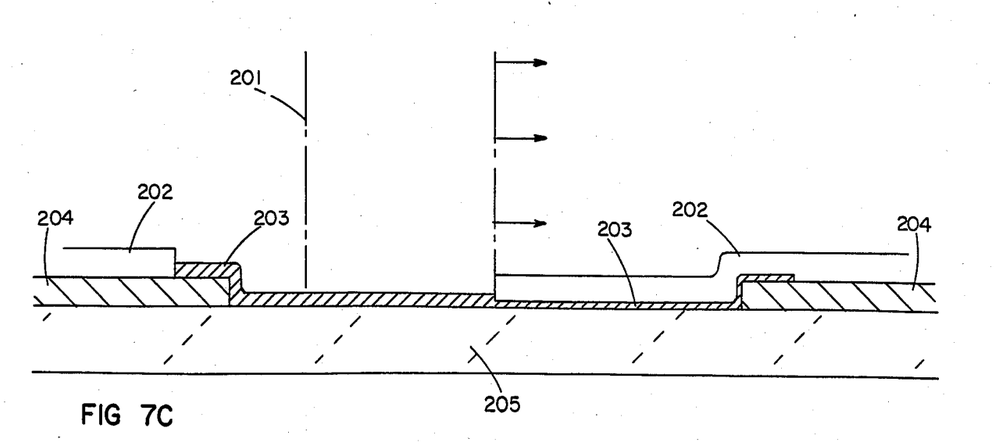

FIGS. 7A-C depict the interaction of absorbed hydrocarbon with the ion beam as the beam is recycled over a specific site. Specifically, in FIG. 7A, the beam 201 is scanning from left to right to convert absorbed hydrocarbon layer 202 to carbonaceous deposit 203, and thus repair the defect in chrome layer 204 on substrate 205. After the scan shown in FIG. 7A is complete, the beam does not return to the precise location depicted for a period that allows the absorbed hydrocarbon layer to reform on top of the carbonaceous layer (FIG. 7B). Then, the beam is returned to again scan from left to right (FIG. 7C), converting the replenished absorbed hydrocarbon layer to additional carbonaceous deposit.

The choice of hydrocarbon for any particular application depends inter alia upon the particular deposition apparatus employed, and upon the requirements for thin layer adsorption of hydrocarbon monolayers at the substrate surface site. To provide sufficient hydrocarbon concentration at the surface, it is generally desirable to use a hydrocarbon whose vapor pressure is high enough to be absorbed rapidly upon the substrate under the temperature and pressure conditions prevailing at the surface.

In certain cases, it is further desirable to provide relatively high gas pressure in the gas delivery tube. In order to maintain a relatively high concentration of hydrocarbon at the deposition site while at the same time avoiding unstable operation of the focussing column, or beam dispersal as the beam travels through chamber 30, it is desirable to maintain different hydrocarbon pressures in the two regions, i.e., a very low pressure along the beam line in chamber 30, and a relatively higher pressure in the region immediately adjacent the site. Apparatus for helping to accomplish these goals is shown in FIGS. 3-6 (described later herein) which depict features that can be combined with each other, or can be used individually, with the apparatus diagrammed in FIG. 1.

AUGMENTED DEPOSITION

It is found that the interaction of the beam with the absorbed hydrocarbon may be inadequate to provide a useful deposit or a sufficient rate of deposit. It is therefore desirable to (a) select as the hydrocarbon that will primarily interact with the ion beam, a relatively large molecule that is capable of substantial adsorption at the deposit site under pressure and temperature conditions that exist at the site and (b) provide a carrier substance that is more volatile than the hydrocarbon, to physically act upon the hydrocarbon to deliver it to the site in the vacuum chamber, where the larger hydrocarbon is effective absorbed and interacts with the beam to produce a deposit in an augmented way. The carrier is chosen (a) not to interfere with the deposit process, (b) preferably, to contribute to the deposit, to the extent it is also adsorbed, and (c) to the extent not adsorbed, to be removed by the associated vacuum pump.

This sytem enables the interactive hydrocarbon substance to reach the site under pressure and temperature conditions that are favorable to the desired treatment. For example, it is undesirable for the interactive substance to condense in the delivery system under the pressure conditions that exist there, as this may cause, over time, undesirable variation in the concentration of the interactive substance delivered to the site as well as other time dependent instabilities. On the other hand, heating of the substance to avoid such condensation is undesirable because if the substance arrives at the site at temperatures too different from that of the site itself, it can cause such thermal distortion of the substrate that the accuracy of the finely focused deposit can be impaired. The multiple component system just described can deliver the interactive substance without substantial condensation in the delivery system and at substantially the same temperature as the substrate, in condition to be readily absorbed upon the substrate as it arrives, thus to augment the deposit process in a satisfactory way.

The interactive hydrocarbon species may be a condensible hydrocarbon carried through a delivery tube by a larger concentration of a more volatile carrier, which may also be, but need not be, a hydrocarbon. In such an arrangement, the molecules of carrier vapor are propelled along the tube with a directed bulk velocity sufficient to act by collision upon the interactive gas molecules, to carry them to the site.

The mixture of carrier and interactive hydrocarbon substance may emanate from a container holding a solution of the two species in liquid phase, and connected by a delivery tube to the site within the container vacuum chamber. By appropriate selection of the species, the evaporation rate of the two species can be predetermined to achieve the desired carrier effect.

The carrier should have a high enough vapor pressure so that it will carry the hydrocarbon and will not condense on the substrate: for example, a vapor pressure of at least 1 torr at room temperature. Preferably, the carrier is a liquid at room temperature. The carrier should be chemically compatible with the interactive substance so that it does not undergo chemical reaction that could destroy the interactive substance. The carrier may, but need not in all instances, be soluble with the interactive substance.

The carrier may be a light volatile organic liquid such as pentane, hexane, heptane, octane, gasoline, acetone or benzene. Two specific carriers that can be used are octane and acetone. In some respects, octane works better as a carrier vapor than acetone because it has a lower vapor pressure than acetone and therefore does not evaporate from the reservoir as quickly, allowing longer run times. Octane has an effective vapor pressure of about 5 millitorr under conduit conditions, as determined by pumping a small open vessel containing octane with a turbopump.

The interactive hydrocarbon species should have a low enough vapor pressure to be physically absorbed on the substrate at pressures created by the jet. It should be chemically compatible with the carrier and have a critical temperature above the substrate temperature so that it its local concentration at the substrate surface can be enhanced by a process of adsorption. It is desirable that the hydrocarbon exist as a liquid at standard temperature and pressure (STP). Finally, the hydrocarbon should have a relatively high carbon content to form a carbonaceous layer as rapidly as possible. One effective hydrocarbon is tetramethylpentadecane (TMPD), for example 2,6,10,14-TMPD.

It is possible to operate the system with the local pressure at the point of beam impact on the substrate in the range so the TMPD is generally physically absorbed on the surface and the octane generally evaporates away. The pressure in the work chamber when there is no vapor coming out through the jet (described in more detail below) is less than $5 \times 10^{-6}$ torr. At that pressure little if any carrier or TMPD would be physically absorbed on the surface of the substrate. The jet provides pressure enhancement at the point of beam impact, i.e., it enables a relatively high local concentration of hydrocarbon at the deposition site, while permitting there to a low pressure in the ion optics column.

The use of the above-described transport system inhibits condensation of the hydrocarbon on the walls of the delivery tube, but once the two components exit from the jet, most of the carrier vapor will evaporate away and the interactive hydrocarbon loses its bulk velocity and will absorb at the region surrounding the impact point of the beam.

Figure 5:
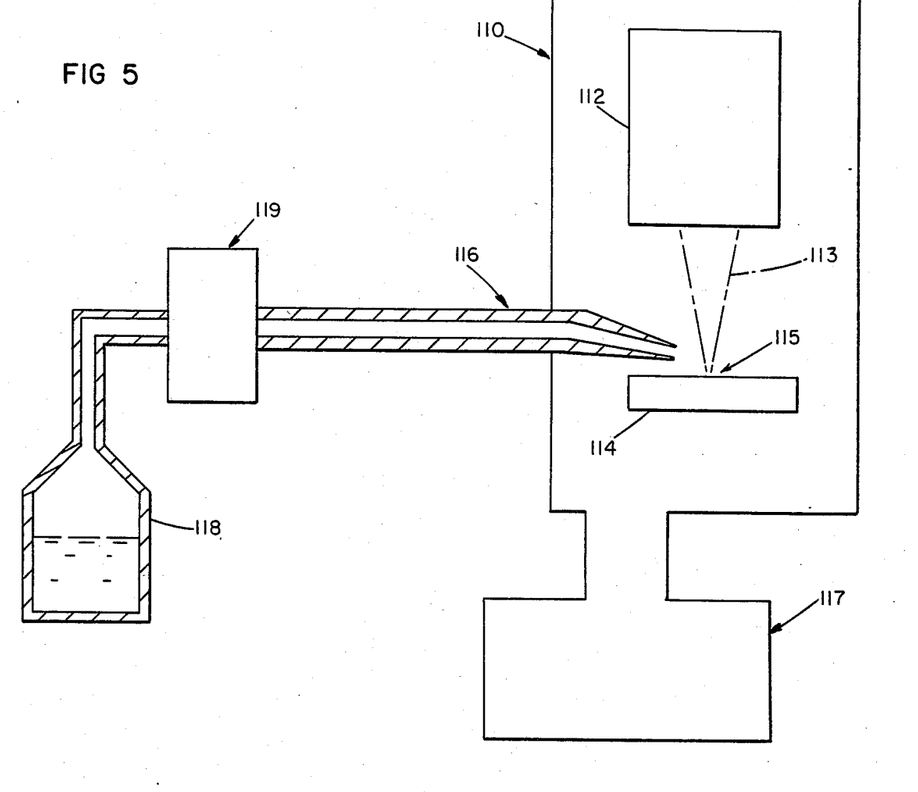
FIG. 5 is a diagrammatic representation of one two-fluid transport system.

FIG. 5 is a diagram of one specific apparatus for two-fluid transport. Vacuum chamber 110 contains ion source and optics 112 which emits focused Ga ion beam 113 that strikes substrate 114 at impact point 115. Gas delivery tube 116 terminates close to point 115. Chamber 110 is pumped by vacuum pump 117. The two-component fluid (e.g. TMPD and octane) is contained in reservoir 118, and its gaseous flow is regulated by leak valve 119, which may be either an on/off valve or a combination of on/off and flow regulating valves.

Figure 6:
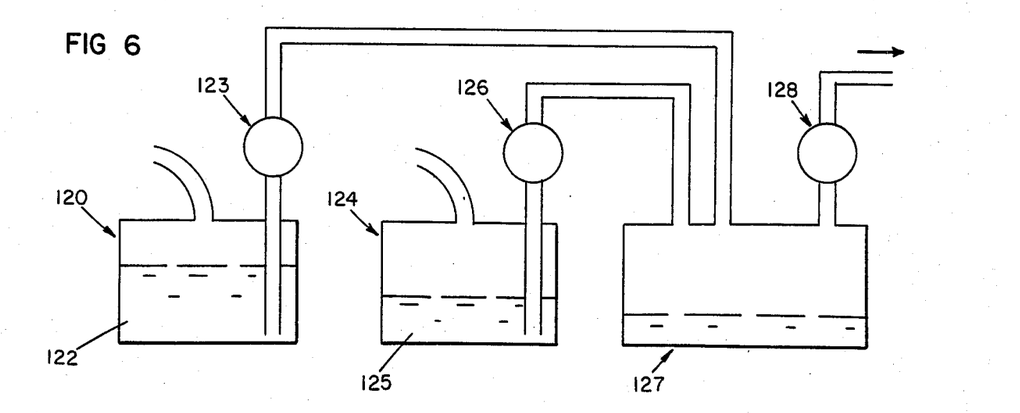
FIG. 6 is a diagrammatic representation of a second two-fluid transport system.

FIG. 6 is a diagram of an alternative apparatus for two-fluid transport having a separate reservoir for each of the two fluids. Reservoir 120 holds carrier fluid 122, whose flow rate is controlled by flow regulating valve 123. Reservoir 124 holds ion-depositable gas 125 whose flow rate is controlled by flow regulating valve 126. Reservoir 127 holds the two-fluid mixture, whose flow is controlled by flow regulating valve 128. The exit port of 128 in this figure is connected to the input port of apparatus such as is described in FIG. 5 for example at leak valve 119.

Vents in reservoirs 120 and 124 communicate atmospheric pressure to the fluids therein to drive liquid into reservoir 127 under the influence of the reduced pressure of chamber 110 communicated through port 128. The apparatus of FIG. 6 is useful to provide a continuing supply of carrier and hydrocarbon to reservoir 127, so that adequate amounts of both are available continuously and a run is not curtailed, e.g. because the carrier has been depleted. Other systems may be possible in which separate reservoirs of hydrocarbon and carrier are maintained, the vapor of each component being provided separately to a single conduit leading to the vacuum chamber, so that mixing of the components in the liquid phase is avoided.

DIFFERENTIAL PUMPING

Figure 3:
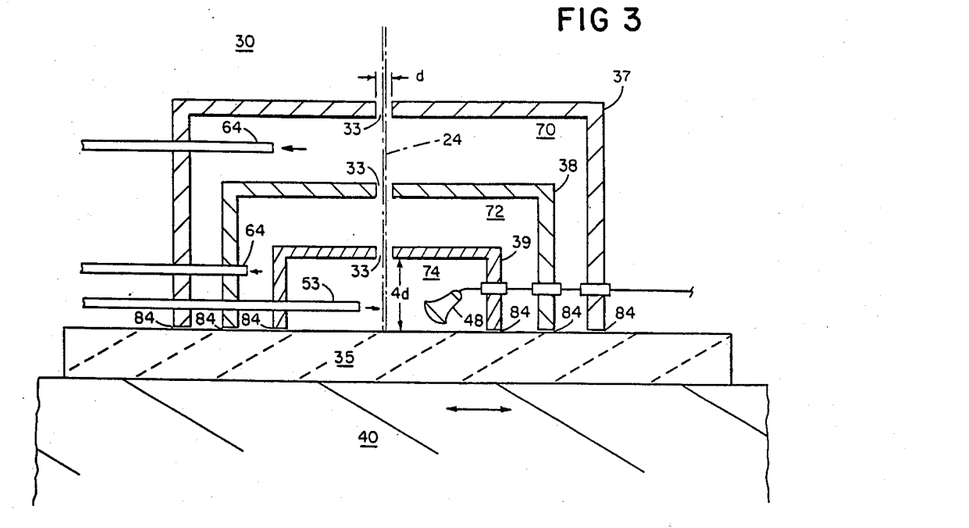
FIG. 3 is a sectional, diagrammatic view of a portion of one embodiment of apparatus for repairing a mask.

In FIG. 3, mask 35 is surrounded by a plurality of rectangular baffles 37, 38, and 39, each of which has a central opening 33 and is aligned with respect to beam 24 and mask 35 to allow the beam to bombard the mask.

The outer baffles 37 and 38 define respectively, two chambers 70 and 72, each communicating with an outlet 64 to a vacuum pump. The inner baffle defines a chamber 74 over the operative site of mask 35. Gas inlet 53 provides hydrocarbon to chamber 74. At the junction between the baffles and the mask 35 are graded differential pressure seals 84 that allow horizontal movement of the mask relative to the nest of baffles, while maintaining a pressure seal.

The vapor pressure is greatest in inner chamber 74 and lowest in outer chamber 70 so that some flow occurs from chamber 74, through chambers 72 and 70, to chamber 30. This flow should be minimized to maintain a relatively high pressure in the region immediately adjacent the mask without causing excessive beam scattering from gas molecules in the beam path in chamber 30.

Due to the low pressures involved, the flow from chamber to chamber will be, in effect, close to a molecular straight-line flow so that there will be angular spread at the orifice. By arranging the spacing between baffles to be at least 3-4 times the diameter d of the central openings 33, the predominant gas flow through an orifice will be deflected by the next baffle. Thus it is possible to maintain pressures in chamber 30 which are low enough (about $3 \times 10^{-5}$ torr) to avoid excessive beam scattering and unstable column operation, while the pressure in chamber 74 is high enough (about $3 \times 10^{-2}$ torr) to allow significant carbon deposition. The diameter of openings 33 should be established to allow satisfactory scanning of the defect site. If the defect encountered is likely to be about 20 microns, for example, openings 33 should be about $2\frac{1}{2}$ times that distance or 50 microns.

To operate according to the augmentation system described above, the hydrocarbon/carrier mixture may be introduced by a supply tube whose exit is in chamber 74, gnerally directed toward the deposit site on the substrate.

JET INLET

Figure 4:
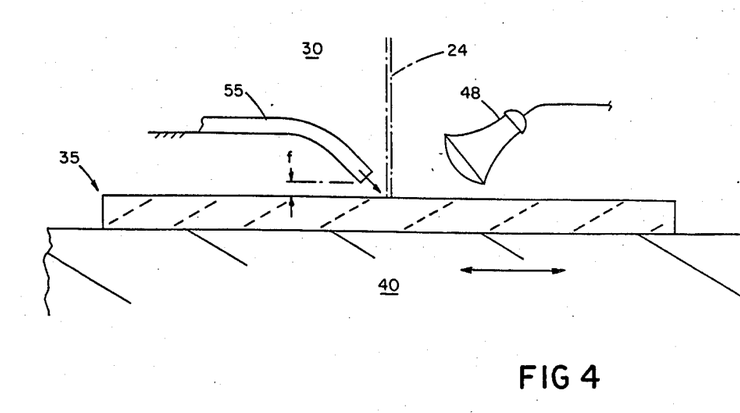
FIG. 4 is a sectional, diagrammatic view of another embodiment of apparatus for repairing a mask.

FIG. 4 shows another device for enhancing localized pressure at the substrate. A carefully, closely positioned gas inlet 55 (e.g., a hypodermic needle or other small diameter tubing) angled slightly to direct the gas flow to the spot of impact of beam 24 on mask 35. As noted above, the molecular gas flow will exit inlet 55 at a diverging angle. Inlet 55 is spaced a distance f above mask 35 on the order of (most preferably approximately equal to) the diameter of the opening of inlet 55, which has a diameter of between $125\mu$ and $250\mu$. Distance f may be adjusted to optimize deposition, and it is preferably between 0.02 and 0.2 mm. Gas pressure at the sample is about $3 \times 10^{-2}$ torr. In that way, the gas concentration at the surface of the mask site is enhanced to allow deposition to proceed more rapidly than sputtering away of the deposited layer; at the same time the gas is localized so that it does not cause excessive scattering of the ion beam. To further contain the gas, the substrate may be contained in a differentially pumped chamber having an opening designed to transmit the ion beam. Again, the augmentation process described above is an important consideration to make the jet effective when used, e.g. with a hydrocarbon interactive gas. The application of Edwin M. Kellogg and John Melngailis, Ser. No. 769,370, filed Aug. 26, 1985 is hereby incorporated by reference.

OTHER EMBODIMENTS

Other embodiments are within the following claims.

Other liquid metal ion beams may be used, such as a gallium, boron, or gold beam. The ion source can be selected to have a higher or lower sputtering rate, depending on whether it is desirable to enhance the rate of deposit or the rate of removal of material.

Gases other than hydrocarbons can be used in the featured differentially pumped apparatus. For example, dangerous or poisonous gases can be used with the apparatus of FIG. 3 and such gases will be trapped largely in the outflow of outlets 64, thus allowing improved control of the gas. Hydrogen gas may be used to reduce the silicon dioxide in the mask substrate, forming an opaque silicon deposit and water vapor. The differentially pumped chambers may be arranged in other ways; for example, all of the chambers may enclose the substrate entirely, so that there is no seal between the substrate and the chamber walls.

In one alternative embodiment, it may be possible to enhance the hydrocarbon concentration at the substrate surface is enhanced by electrostatic interaction. Specifically, the hydrocarbon is provided as a beam of negative ions, attracted to the hydrocarbon beam; the hydrocarbon beam is then electrostatically attracted to the substrate site, which is positively charged from the metal ion beam.

We claim:

1. A method of accurately altering a precisely located site on a substrate, said method comprising
   (a) providing a vacuum chamber,
   (b) providing an energy beam,
   (c) providing a source of a hydrocarbon and a conduit extending between said source and said chamber, said hydrocarbon being capable of being adsorbed on said substrate and of interacting with said energy beam to alter said substrate,
   (d) positioning said substrate in said chamber to be exposed to hydrocarbon delivered by said conduit,
   (e) introducing into said conduit a carrier having a vapor pressure above the vapor pressure of said hydrocarbon, said carrier being in vapor form under conditions existing in said conduit and having a bulk velocity that transports said hydrocarbon by molecular collisions into said chamber, said hydrocarbon being adsorbed on the surface of said substrate, free carrier molecules being drawn off sufficiently rapidly to maintain low pressure in said chamber, and,
   (e) while maintaining said low chamber pressure, directing said energy beam to said site in the presence of said absorbed hydrocarbon, in a manner to convert said hydrocarbon to a coherent carbonaceous deposit of predetermined desired form, adherent to said substrate at said site in order to render said site opaque.

2. The method of claim 1 wherein said energy beam is a charged particle beam or a laser beam.

3. The method of claim 1 wherein said energy beam is focused to control the location of said conversion.

4. The method of claim 1 comprising forming an image of said site prior to depositing said layer, and directing said energy beam on the basis of said image.

5. The method of claim 3 wherein said energy beam is a charged particle beam and said chamber pressure is sufficiently low to allow said focused beam to reach said site.

6. The method of claim 5 wherein said beam is a focused ion beam.

7. The method of claim 5 or 6 wherein said beam is repeatedly directed at a given site location, with sufficient delay between said repetitions to permit said adsorbed hydrocarbon to be replenished from said conduit, said repetitions thereby increasing the thickness of said deposit.

8. The method of claim 1 characterized in that the ratio of the molar concentration of said hydrocarbon to the concentration of said carrier in said conduit is on the order of 0.8 or less.

9. The method of claim 1 characterized in that the pressure in said conduit is approximately 30–500 millitorr.

10. The method of claim 1 characterized in that said carrier compound and said hydrocarbon compound are provided in a single reservoir and are non-reactive with one another under said transporting conditions and under conditions in said reservoir.

11. The method of claim 1 wherein said carrier compound and said hydrocarbon are provided in separate reservoirs.

12. The method of claim 1 characterized in that said carrier has an equilibrium vapor pressure at room temperature on the order of 1–300 torr.

13. The method of claim 1 characterized in that said carrier is an organic compound comprising between one and ten carbon atoms.

14. The method of claim 1 characterized in that said carrier is a straight-chained, branched, or cyclic alkane, alkene, alcohol, aldehyde, ketone, or ether.

15. The method of claim 14 characterized in that said carrier is an alkane having between 5 and 9 carbon atoms.

16. The method of claim 14 wherein said carrier is pentane, hexane, heptane, octane, acetone, or benzene.

17. The method of claim 1 wherein said hydrocarbon has at least 10 carbon atoms.

18. The method of claim 17 wherein said hydrocarbon is an alkane or a mixture of alkanes.

19. The method of claim 1 wherein said hydrocarbon has an equilibrium vapor pressure at room temperature of below 1 torr.

20. The method of claim 1 wherein said hydrocarbon is selected from tetramethylpentadecane, squalene, pyrene, dodecane, vinylanthracene, and diesel fuel.

21. The method of claim 6 wherein said ion beam is provided by a liquid metal ion source.

22. The method of claim 1 characterized in that said chamber pressure is on the order of $10^{-4}$ to $10^{-6}$ torr.

23. The method of claim 1 or 5 characterized in that said site requiring alteration is a transparent defect in a pattern of a photolithographic mask.

24. The method of claim 6 characterized in that said ion beam energy is between about 10 and 70 keV.

25. The method of claim 3 characterized in that said focused beam resolution is on the order of 1 micron or less.

26. The method of claim 1 wherein said hydrocarbon is provided to said chamber through a directed gas inlet positioned to provide a localized supply of said compound at said site.

27. The method of claim 26 wherein said inlet is a small diameter tubing angled with respect to beam axis which ends a distance above the substrate a distance on the order of the tubing diameter.

28. The method of claim 5 or 6 characterized in that an said image of said site is formed by scanning said focused beam over said site and sensing charged particles emitted from said site.

29. A method of altering a precisely localized site on a substrate comprising a silicon oxide, said method comprising
- placing said substrate in a vacuum chamber and forming an image of said site,
- by means of a liquid metal ion source and associated focusing optics, providing a focused ion beam having a spot size smaller than said defect,
- on the basis of said image, scanning the focused ion beam in the presence of hydrogen gas in a manner to reduce said silicon oxide and form an opaque silicon deposit adherent to said substrate at said site to render said site opaque.

30. A method of accurately altering precisely localized sites on a substrate, a first one of said sites being a site at which opaque material is to be deposited, and a second of said sites being a site at which opaque material is to be removed, said method comprising,
- placing said substrate in a vacuum chamber,
- forming an image of said first site,
- by means of an ion source and associated focusing optics, providing a focused ion beam of predetermined energy sufficient to remove said opaque material at said first site,
- introducing hydrocarbon gas in said chamber, localized in the region of said first site, and, simultaneously therewith, maintaining the pressure in said chamber low enough to allow said focused ion beam to pass substantially without gas-created dispersal and, on the basis of said image, scanning said focused ion beam over said first site in a manner to convert hydrocarbon that is provided at said site to a coherent, adherent, opaque carbonaceous deposit on the substrate of predetermined desired form, the rate of said conversion exceeding the rate of any sputtering of material from said substrate, and, at a different time,
- scanning said ion beam over the second site in the absence of said hydrocarbon gas in a manner to remove opaque material.

31. The method of claim 30 wherein, during the deposition, the ion beam current density is at least $3 \times 10^{-5}$ amps, and the ion beam spot size is less than 1.0 micron.

32. The method of claim 30 wherein, during the deposition, the ion beam is scanned over the first site at a rate allowing the hydrocarbon to be absorbed at the given beam location and thereby be replenished at that location before the ion beam returns.

33. The method of claim 32 wherein, during said deposition, said scanned beam dwells at a point for a period between 0.1 and 200 microseconds.

34. The method of claim 32 wherein, during said deposition, said scanned beam returns to a point in a period between 0.1 and 20 milliseconds.

35. A method of accurately altering a precisely located site on a substrate, said method comprising
  (a) providing a vacuum chamber,
  (b) providing an energy beam,
  (c) providing a source of a depositable gas and a conduit extending between said source and said chamber, said depositable gas being capable of being adsorbed on said substrate and of interacting with said energy beam to alter said substrate,
  (d) positioning said substrate in said chamber to be exposed to the depositable gas delivered by said conduit,
  (e) introducing into said conduit a carrier having a vapor pressure above the vapor pressure of said depositable gas, said carrier being in vapor form under conditions existing in said conduit and having a bulk velocity that transports said depositable gas by molecular collisions into said chamber, said depositable gas being absorbed on the surface of said substrate, free carrier molecules being drawn off sufficiently rapidly to maintain low pressure in said chamber, and,
  (e) while maintaining said low chamber pressure, directing said energy beam to said site in the presence of said absorbed depositable gas, in a manner to convert said depositable gas to a coherent deposit of predetermined desired form, adherent to said substrate at said site in order to render said site opaque.

* * * * *

UNITED STATES PATENT AND TRADEMARK OFFICE
CERTIFICATE OF CORRECTION

PATENT NO. : 4,698,236

DATED : October 6, 1987

INVENTOR(S) : Edwin M. Kellogg et al.

It is certified that error appears in the above-identified patent and that said Letters Patent are hereby corrected as shown below:

Col. 9, line 3, "deflect" should be --defect--;

Col. 9, line 20, "absorbed" should be --adsorbed--;

Col. 9, line 25, "absorbed" should be --adsorbed--;

Col. 9, line 29, "absorbed" should be --adsorbed--;

Col. 9, line 38, "absorbed" should be --adsorbed--;

Col. 9, line 59, "absorbed" should be --adsorbed--;

Col. 10, line 1, "effective" should be --effectively--;

Col. 10, line 1, "absorbed" should be --adsorbed--;

Col. 10, line 25, "absorbed" should be --adsorbed--;

Col. 10, line 64, "absorbed" should be --adsorbed--;

Col. 11, line 10, "absorbed" should be --adsorbed--;

Col. 11, line 16, "absorbed" should be --adsorbed--;

Col. 11, line 26, "absorb" should be --adsorb--;

UNITED STATES PATENT AND TRADEMARK OFFICE
CERTIFICATE OF CORRECTION

PATENT NO. : 4,698,236
DATED : October 6, 1987
INVENTOR(S) : Edwin M. Kellogg et al.

It is certified that error appears in the above-identified patent and that said Letters Patent are hereby corrected as shown below:

Col. 13, claim 1, line 53, "absorbed" should be --adsorbed--;

Col. 16, line 6, "absorb" should be --adsorb--;

Col. 16, claim 35, line 33, "absorbed" should be --adsorbed--;

Col. 16, claim 35, line 39, "absorbed" should be --adsorbed--.

Signed and Sealed this

Twenty-second Day of March, 1988

Attest:

DONALD J. QUIGG

*Attesting Officer*          *Commissioner of Patents and Trademarks*